United States Patent [19]
Armstrong, II et al.

[11] Patent Number: 5,187,396
[45] Date of Patent: Feb. 16, 1993

[54] DIFFERENTIAL COMPARATOR POWERED FROM SIGNAL INPUT TERMINALS FOR USE IN POWER SWITCHING APPLICATIONS

[75] Inventors: Gene L. Armstrong, II, Garland; Wallace E. Matthews, Richardson, both of Tex.

[73] Assignee: Benchmarq Microelectronics, Inc., Carrollton, Tex.

[21] Appl. No.: 704,068

[22] Filed: May 22, 1991

[51] Int. Cl.⁵ .................. H03K 5/22; H03K 3/01
[52] U.S. Cl. .................. 307/494; 307/296.1; 307/296.8; 307/243; 307/85
[58] Field of Search .......... 307/296.1, 296.8, 571, 307/243, 44, 52, 60, 85, 86, 494; 323/271, 272, 315, 317; 363/142

[56] References Cited
U.S. PATENT DOCUMENTS

| | | | |
|---|---|---|---|
| 4,767,942 | 8/1988 | Minami et al. | 307/296.8 |
| 4,801,892 | 1/1989 | Yamakoshi et al. | 323/315 |
| 4,812,672 | 3/1989 | Cowan et al. | 323/271 |
| 4,972,098 | 11/1990 | Boudewijns | 307/296.8 |
| 5,027,002 | 6/1991 | Thornton | 307/296.8 |
| 5,034,625 | 7/1991 | Min et al. | 307/296.1 |

Primary Examiner—David R. Hudspeth
Assistant Examiner—Richard Roseen
Attorney, Agent, or Firm—Ross, Howison, Clapp & Korn

[57] ABSTRACT

A differential comparator is provided for controlling two switches (40) and (42) to switch two supplies (10) and (12), respectively, to a common output node (22). The decision/control circuit (44) outputs two control signals (46) and (48), the logic state thereof being a function of whether supply (10) is higher than supply (12) or supply (12) is higher than supply (10). The operating power for the decision/control circuit (44) is derived from the supplies (10) and (12), and not from the common output node (22), such that when the switches (40) and (42) are closed and no power is being supplied by either of the supplies (10) and (12), the decision/control circuit (44) has sufficient power to make a decision.

18 Claims, 2 Drawing Sheets

DIFFERENTIAL COMPARATOR POWERED FROM SIGNAL INPUT TERMINALS FOR USE IN POWER SWITCHING APPLICATIONS

TECHNICAL FIELD OF THE INVENTION

The present invention pertains in general to differential comparators, and more particularly, to a differential comparator that receives its power from the input terminals therefor for utilization in a power switching application to switch between power supplies whose outputs comprise the inputs to the differential comparator.

BACKGROUND OF THE INVENTION

In active power switching applications, a decision/controller circuit is provided to control two switches to select between one of two power supplies having the higher voltage. These decision/controller circuits typically are connected to a power terminal on the output of the two switches to receive the operating power therefrom. In operation, these decision/controller circuits receive as comparison inputs the voltages output from each of the power supply. Two control outputs are provided to control each of the two switches, depending upon the relative input levels.

One disadvantage to the present active decision/controller circuits is that they are powered from the output side of the switches. This presents a disadvantage during a power-up situation wherein no power supplies are initially present, or there is an insufficient power level on either of the supply inputs.

In the power-up or low power condition, the decision/controller circuit is essentially inoperative until the switches close to provide power thereto. This is due to the fact that the control for the switches requires power to be applied to the decision/controller circuit prior to either of the switches being activated. Controller lockout has been observed in previous implimentations. This condition is due to the combination of finite source impedance and the existence of parasitic bipolar transistors which, in a power up condition, tend to clamp the output node to ground, rendering the controller inoperable. One solution has been to attempt to favor one of the switches in order to force the power to be steered in one direction. In view of the above disadvantages, there exists a need for a power steering circuit that receives its operating power from a supply different from the output of the switches in a power steering circuit for at least the power-up condition in order to make a valid decision.

SUMMARY OF THE INVENTION

The present invention disclosed and claimed herein comprises a differential circuit for differentiating between two input signals. A first voltage signal is provided in the form of a first power supply and a second voltage signal is provided in the form of a second power supply. A decision circuit is provided for receiving as inputs the first and second voltage signals. The decision circuit detects which of the first and second voltage signals is the highest and outputs a signal indicating the highest voltage power supply. The decision circuit is powered from both the first and the second voltage signals, at least during the time a decision is being made by the decision circuit.

In another aspect of the present invention, the decision circuit is powered at all times from either the first and the second voltage signal. Further, the decision circuit is operable over substantially all ranges of the first and second voltage signals. The output is powered from both the first and second voltage signals also.

In yet another aspect of the present invention, a first switch is provided for being connected between a common voltage output and the first voltage signal. A second switch is provided for being connected between the common voltage output and the second voltage signal. A control circuit is provided for controlling the operation of the first and second switches to connect the common voltage output to the one of the first and second voltage signals determined by the decision circuit to be the highest.

In a yet further aspect of the present invention, the decision circuit comprises a differential comparator. The differential comparator has a single-ended output that has a first state and a second state, the first state corresponding to the condition where the first voltage signal is higher than the second voltage signal, and the second state corresponding to the condition where the first voltage signal is less than the second voltage signal. An invertor circuit is provided for inverting the single-ended output to provide a second signal, the second signal controlling the second switch and the single-ended output comprising the first control signal to control the first switch. Driving circuitry is provided for driving the first and second switches. The driving circuitry is powered from the first and the second voltage signal.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
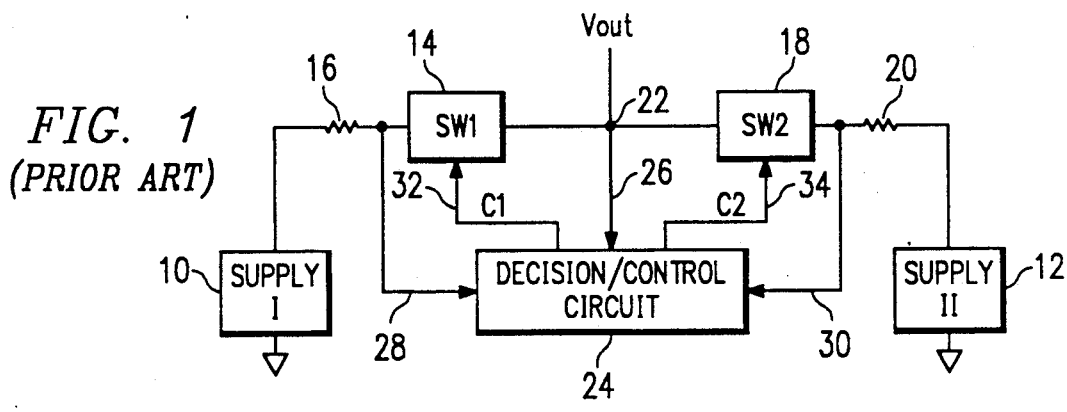
FIG. 1 illustrates a block diagram for the prior art power switching control system.

Referring now to FIG. 1, there is illustrated a block diagram for a prior art system for selecting one of two power supplies. First and second power supplies 10 and 12, respectively, are provided having the negative terminals thereof connected to ground in a positive supply system. The positive terminal of the supply 10 is connected to one side of a switch 14, the supply 10 having an internal resistance 16 associated therewith. Similarly, the supply 12 has a positive terminal thereof connected to one side of a switch 18 through an internal resistance 20, associated with the supply 12. The other side of both of the switches 14 and 18 are connected together to a common node 22 labelled $V_{OUT}$. A decision/control circuit 24 is provided that is powered from the $V_{OUT}$ terminal 22 through a voltage line 26. Decision/control circuit 24 is operable to receive as inputs the voltages on the inputs to each of the switches 14 and 18 on lines 28-30, respectively. The decision/control circuit 24 compares the voltages on each of the lines 28 and 30 and selects the one that is higher by controlling the associated switches 14 and 18 with control inputs 32 and 34, respectively.

Figure 2:
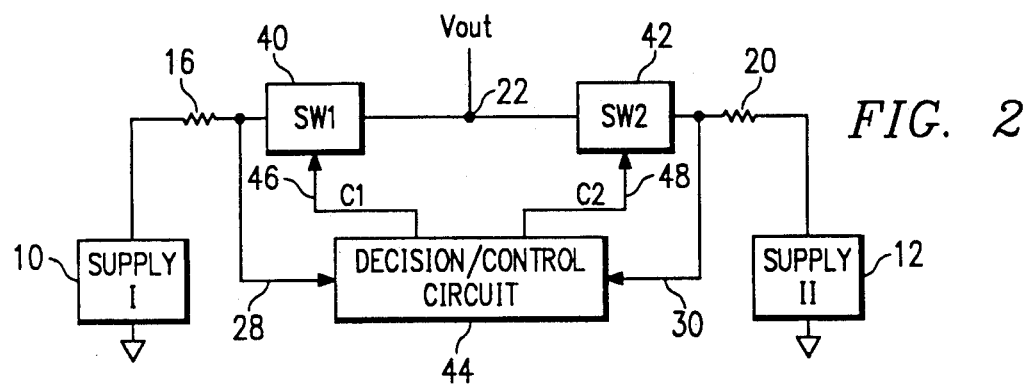
FIG. 2 illustrates a block diagram of the differential comparator for steering the power supplies in accordance with the present invention.

Referring now to FIG. 2, there is illustrated a block diagram for the power steering circuit of the present invention. The supplies 10 and 12 are connected to one side of switches 40 and 42, that correspond to switches 14 and 18 in FIG. 1. The output sides of switches 40 and 42 are connected to the common node 22 that provides the $V_{OUT}$ voltage. A decision/control circuit 44 is provided that is operable to receive as voltage inputs the voltages on the output of supplies 10 and 12 on lines 28 and 30, as was also the case with the prior art system of FIG. 1. However, as will be described hereinbelow, the decision/control circuit 44 receives its power from the input lines 28 and 30 and not from the common voltage output node 22. Therefore, the generation of the control signals output on lines 46 and 48 to switches 40 and 42, respectively, during a power-up condition is a function only of the power output by the supplies 10 and 12 and is not dependent upon either one of the switches 40 and 42 being in a closed or open state.

Figure 3:
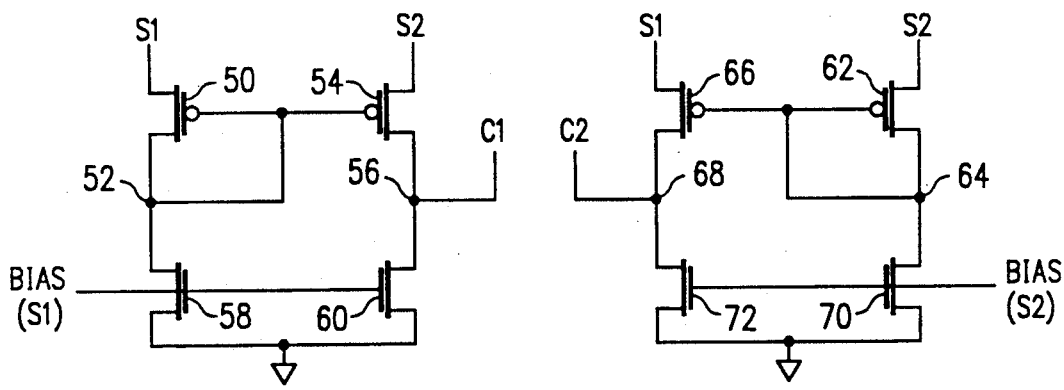
FIG. 3 illustrates a schematic diagram for the control circuitry to generate the control outputs for the switches.

Referring now to FIG. 3, there is illustrated a detailed schematic diagram of one embodiment of a decision/control circuit 44. The circuit is configured of two differential comparators, one for generating the control signal C1 on line 46 and one for generating the control signal C2 on line 48. The first differential comparator generating the control signal C1 comprises a P-channel transistor 50, having the drain thereof connected to the output of the first supply 10 (S1) and the source thereof connected to a node 52. The source at node 52 is connected to the gate of transistor 50. The node 52 is also connected to the gate of a second P-channel transistor 54 which has the drain thereof connected to the output of the second supply 12 (S2) and the source thereof connected to a node 56 that comprises the output signal C1 for controlling the switch 40. The node 52 is connected through the source/drain path of an N-channel transistor 58 to ground. Similarly, the node 56 is also connected to ground through the source/drain path of an N-channel transistor 60. The gates of transistors 58 and 60 are connected together and to a bias signal that is a function of the voltage level of S1 for the first supply 10, such that transistors 58 and 60 operate in a current mirror fashion.

The remaining portion of the circuit operates similar to that constructed with the transistors 50, 54, 58 and 60. A P-channel transistor 62 has the source/drain path thereof connected between S2 and a node 64, with node 64 connected to the gate of transistor 62. A P-channel transistor 66 has a source/drain path thereof connected between S1 and an output node 68, with the gate thereof connected to the gate of transistor 62 and node 64. An N-channel transistor 70 has the source/drain path thereof connected between node 64 and ground and an N-channel transistor 72 has the source/drain path thereof connected between the output node 68 and ground.

In operation, the differential comparator circuits receive their operating power from the supplies 10 and 12, which also act as inputs. For example, the differential circuit associated with the output C1 on output node 56 operates such that when S1 decreases to a voltage below S2, transistor 50 will pull node 52 low, thus pulling the gate of transistor 54 low, resulting in transistor 54 turning on harder. The current in transistor 58 and transistor 60 decreases as a result of the bias decreasing, thus decreasing the current sunk through transistor 60 through node 56. Therefore, the voltage on node 56 would go up. In the opposite situation where S2 decreases below S1, node 56 would be pulled low. The portion of the circuit connected to output node 68 and control signal C2 operates in the opposite manner with the voltage on S2 falling below S1, causing transistor 62 to pull node 64 down and turn transistor 66 on, thus resulting in node 68 being pulled high. When S1 falls below S2, transistor 66 begins to turn off and node 68 falls to ground.

Figures 4, 5, 6:
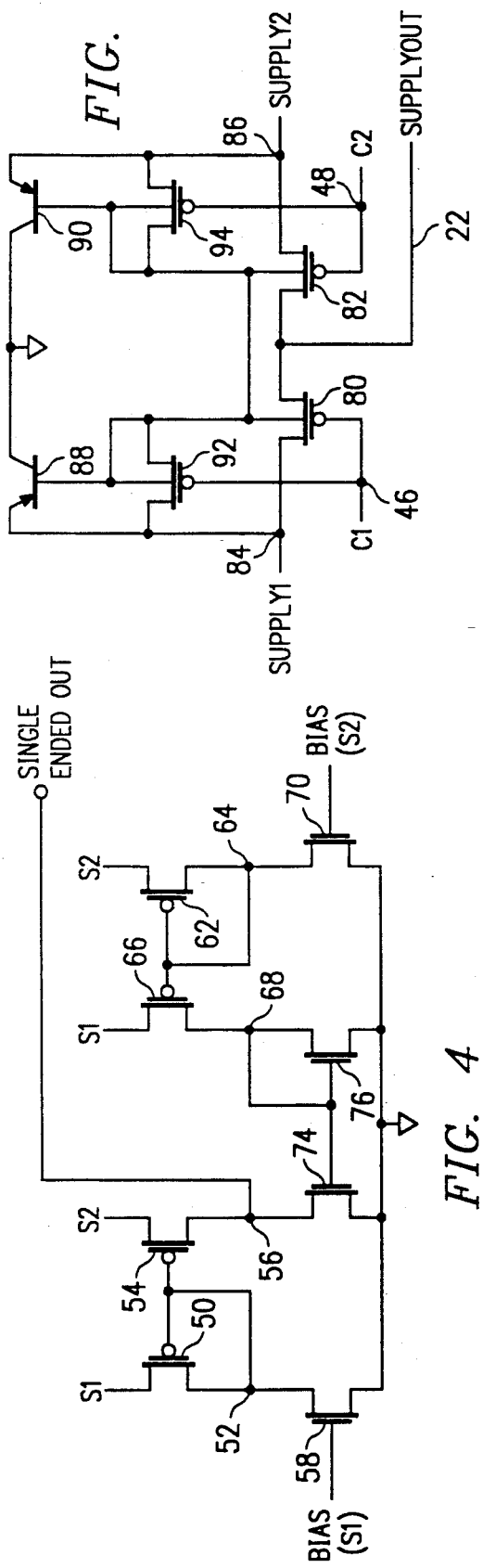
FIG. 4 illustrates the preferred embodiment of the control circuits of FIG. 3 with increased gain, and providing a single-ended output.
FIG. 5 illustrates the switching circuitry utilized in conjunction with the power steering circuit of the present invention.
FIG. 6 illustrates a detailed schematic diagram of the power steering and differential comparator circuit of the present invention.

Referring now to FIG. 4, there is illustrated a schematic diagram of the preferred embodiment of the present invention. The structure is similar to the structure in FIG. 3, with the exception that the N-channel transistor 60 is replaced by an N-channel transistor 74 and the N-channel transistor 72 is replaced by an N-channel transistor 76. N-channel transistor 74 has the source/drain path thereof connected between the node 56 and ground and the N-channel transistor 76 has the source/drain path thereof connected between node 68 and ground. The gate of transistor 74 is connected to the gate of transistor 76 and also to node 68, such that transistor 76 is constructed in a diode configuration. The only output from the circuit is from the node 56 which provides a single ended output.

In operation, when S1 decreases below S2, the transistor 50 pulls node 52 down, turning transistor 54 on harder to thereby raise node 56 due to the increased current sourced thereto. Additionally, transistor 76 is mirrored to transistor 74, such that when S1 decreases below S2, the transistor 62 pulls node 64 up, turning transistor 66 off, and the current through transistor 76 is decreased, and subsequently the current through transistor 74 is decreased. Therefore, the operation of transistors 66 and 76 results in a faster pull up of node 56. Alternatively, when S2 falls below S1, transistor 62 pulls node 64 down, turning transistor 66 on harder and increasing the current through transistor 76. This current is mirrored through to transistor 74, which pulls node 56 down. At the same time, transistor 54 is turned off due to the gate voltage rising high relative to the drain with S2 disposed thereon. This results in node 56 being pulled down to ground at a faster rate. The circuit of FIG. 4 therefore has more gain than the circuit of FIG. 3.

Referring now to FIG. 5, there is illustrated a detailed schematic diagram of the switches 40 and 42. The switch 40 is comprised of a P-channel transistor 80 and the switch 42 is comprised of a P-channel switch 82. The supply 10 is input on a node 84 and the supply 12 is input on node 86. Node 84 is input to one side of the source/drain path of transistor 82, the other side connected to node 22. Similarly, the node 86 is connected to one side of transistor 82, the other side connected to node 22. The node 84 is connected to the emitter of a parasitic PNP transistor 88, the collector thereof connected to ground and the base thereof connected to the well of the P-channel transistors 80 and 82. Similarly, the node 86 is connected to the emitter of a parasitic PNP transistor 90, the collector of which is connected to ground and the gate of which is connected to the well of P-channel transistors 80 and 82. A P-channel transistor 92 has a source/drain path thereof connected between node 84 and the well of transistors 80 and 82 and the gate thereof connected to node 46 on the gate of transistor 80. The well of transistor 92 is also connected to the well of transistors 80 and 82. A P-channel transistor 94 is provided having the source/drain path thereof connected between the node 86 and the well of transistors 80 and 82. The well of transistor 94 is also connected to the well of transistors 80 and 82. The gate of transistor 94 is connected to the node 48 on the gate on transistor 82.

Referring now to FIG. 6, there is illustrated a detailed schematic diagram of the decision/control circuit 44 utilizing the circuit of FIG. 4 and an invertor output. The node 56, described above, comprises the single ended output, which is connected to the gate of a P-channel transistor 96, transistor 96 having the source-drain path thereof connected between S1 and a node 98. The node 98 is connected through the source/drain path of the N-channel transistor 100 to ground. The gate of transistor 100 is connected to S2 such that transistor 100 is controlled by S2. Transistors 96 and 100 form a first invertor having the input thereof connected to node 56. The node 56 is connected through the source/drain path of an N-channel transistor 102 to ground, the gate of which is connected to the node 98. The transistor 102 provides a hysteresis operation.

Node 98 is connected to the gate of a P-channel transistor 104 and the gate of an N-channel transistor 106, transistors 104 and 106 forming a second invertor. The source/drain path of transistor 104 is connected between S2 and node 108, and the source/drain path of transistor 106 is connected between node 108 and ground. Node 108 is input to the gates of the P-channel transistor 110 and an N-channel transistor 112. The source/drain path of transistor 110 is connected between S1 and a node 114 and the source/drain path of the transistor 112 is connected between node 114 and ground. Transistors 110 and 112 comprise a third invertor with node 114 comprising the output C2 and node 108 comprising the output C1.

Since the control signal for turning on either one of the transistors 80 and 82 is required to be low when the supply associated therewith is the highest supply, it is necessary to maintain the other control signal at a high voltage. Therefore, the supply pulling control node 46 or 48 high would need to be supplied from the opposite supply. For example, if supply S1 were higher than supply S2, C1 would be low and C2 would be high. Therefore, C2 would be pulled high by supply S1. This can be seen in that node 114 would be pulled high through transistor 110 which is connected to supply S1. Similarly, C1 connected to node 108 would be pulled high by transistor 104, which is connected to supply S2. Of course, supply S1 would also result in turning on transistor 106 by pulling node 98 high through transistor 96 as a result of node 56 being low.

In summary, there has been provided a differential comparator for receiving two input signals and outputting a single ended output signal representing the difference between the two input signals. Additionally, the differential comparator receives the operating power therefor from the input signals. The differential comparator is utilized in a two-supply system to select between two supplies by monitoring the voltages on the two supplies and determining which is the higher supply. Control signals are output to switch the supplies in.

Although the preferred embodiment has been described in detail, it should be understood that various changes, substitutions and alterations can be made therein without departing from the spirit and scope of the invention as defined by the appended claims.

What is claimed is:

1. A differential circuit for differentiating between two input signals, comprising:
    a first voltage signal;
    a second voltage signal;
    a decision circuit for receiving as inputs said first and second voltage signals and for determining which of said first and second voltage signals is the highest;
    said decision circuit powered from said first voltage signal and said second voltage signal at least during the time a decision is being made by said decision circuit; and
    a control output associated with said decision circuit for outputting a driving signal indicating which of said first and second voltage signals is the highest.

2. The circuit of claim 1, wherein said first voltage signal comprises a first supply and said second voltage signal comprises a second supply.

3. The circuit of claim 1, wherein said decision circuit comprises means to allow said decision circuit to be powered from said first and second voltage signals during a power-up condition, and power-up condition existing when both said first and second voltage signals are initially below a predetermined level at a first point in time and subsequently at least one of said first and second voltage signals rises above said predetermined level at a second point in time, during which said decision circuit operates.

4. The circuit of claim 1, wherein said decision circuit is powered from said first and said second voltage signals at all times.

5. The circuit of claim 4, wherein said driving signal output by said control output is powered from at least one of said first and said second voltage signals.

6. A differential circuit for differentiating between two input signals, comprising:
    a first voltage signal;
    a second voltage signal;
    a decision circuit for receiving as inputs said first and second voltage signals and for determining which of said first and second voltage signals is the highest;
    said decision circuit powered from said first voltage signal and said second voltage signal at least during the time a decision is being made by said decision circuit;
    a control output associated with said decision circuit for outputting a driving signal indicating which of said first and second voltage signals is the highest;
    a common voltage output;
    a first switch for being connected between said common voltage output and said first voltage signal;
    a second switch for being connected between said common voltage output and said second voltage signal; and
    each of said first and second switches having a control input connected to said control output such that the one of said first and second voltage signals that is indicated as being the highest controls the associated one of said first and second switches through said control output to connect the respective one of said first and second voltage signals to said common voltage output.

7. The circuit of claim 6, and further comprising at least one inverter having the input thereof connected to said control output of said decision circuit, wherein the output of said decision circuit comprises a first control output signal and the output of said inverter comprises a second control output signal, said first and second control output signals controlling said first and second switches, respectively, such that only one of said first and second switches is operable at a given time.

8. The circuit of claim 6 wherein said output associated with said decision circuit comprises a double ended output.

9. The circuit of claim 1, wherein said decision circuit is a differential comparator having a single-ended output.

10. A power steering circuit for selecting the highest voltage on first and second power supplies, comprising:
a common voltage output;
a first switch for being connected between said common voltage output and the first power supply;
a second switch for being connected between said common voltage output and said second power supply;
a decision circuit having a first input for receiving the voltage from the first power supply and a second input for receiving the voltage from the second power supply, said decision circuit for detecting which of said first and second power supplies has the highest voltage;
said decision circuit powered from said first and second inputs at least during the time a decision is being made by said decision circuit; and
first and second control outputs associated with said decision circuit for controlling the state of said first and second switches, respectively, to connect said common voltage output to the one of the first and second power supplies having the highest voltage thereon.

11. The circuit of claim 10, wherein said decision circuit is powered from said first and second input at least during a power-up condition, said power-up condition comprising whenever the voltage on said first and second input is initially below a predetermined level during a first time, and either said first or second input rises to a voltage above said predetermined level at a second and later time.

12. The circuit of claim 10, wherein said decision circuit is powered at all times from said first and second input.

13. The circuit of claim 10, wherein:
said decision circuit comprises a differential comparator having a single-ended output that is at a first logic state when said first input is above said second input and at a second logic state when said first input is below said second input; and
at least one output invertor for receiving said single ended output and for generating the inverse of said single-ended output;
the single-ended output comprising a first control signal and the output of said invertor comprising a second control signal, said first and second control signals controlling said first and second switches, respectively.

14. The circuit of claim 10, wherein said decision circuit is powered at all times from said first and second input and is operable to make a decision for substantially all voltage ranges on said first and second inputs.

15. A method for differentiating between two input signals, comprising:
providing a first voltage signal;
providing a second voltage signal;
providing a decision circuit for receiving the first and second voltage signals and determining which of the first and second voltage signals is the highest;
powering the decision circuit from the first and second voltage signals on the first and second inputs during at least the time a decision is being made by the decision circuit; and
outputting a signal indicating which of the first and second voltage signals is the highest.

16. The method of claim 15, wherein the step of powering comprises powering the decision circuit at all times from the first and second voltage signals on the first and second inputs.

17. The method of claim 16, wherein the step of outputting a signal comprises outputting a signal that is powered from either of the first or second voltage signals from the first and second inputs, respectively, to the decision circuit.

18. A method for differentiating between two input signals, comprising:
providing a first voltage signal;
providing a second voltage signal;
providing a decision circuit for receiving the first and second voltage signals and determining which of the first and second voltage signals is the highest;
powering a decision circuit from the first and second voltage signals on the first and second inputs during at least the time a decision is being made by the decision circuit;
outputting a signal indicating which of the first and second voltage signals is the highest;
providing a common voltage output;
providing a first switch connected between the first voltage signal and the common voltage output;
providing a second switch connected between the second voltage signal and the common voltage output; and
switching the respective one of the first and second switches when the output indicates that the associated first and second voltage signal is the highest.

* * * * *